United States Patent [19]
Rossmeisl et al.

[11] Patent Number: 5,794,329
[45] Date of Patent: Aug. 18, 1998

[54] SUPPORT APPARATUS FOR CIRCUIT BOARD

[75] Inventors: Mark E. Rossmeisl, Beverly, Mass.; Edna M. Murby, N. Kingstown, R.I.

[73] Assignee: MPM Corporation, Franklin, Mass.

[21] Appl. No.: 391,394

[22] Filed: Feb. 27, 1995

[51] Int. Cl.[6] .............................. H05K 3/30; H05K 13/04; H05K 13/08
[52] U.S. Cl. .............................. 29/743; 29/703; 29/837; 294/64.1
[58] Field of Search .............................. 29/703, 721, 739, 29/740, 741, 743, 744, 833, 837, 842, DIG. 44; 279/3; 294/64.1; 414/737, 752

[56] References Cited

U.S. PATENT DOCUMENTS

| | | | |
|---|---|---|---|
| Re. 34,615 | 5/1994 | Freeman | 348/95 |
| 4,196,513 | 4/1980 | Harigane et al. | 29/741 |
| 4,216,717 | 8/1980 | Hall et al. | 101/123 |
| 4,434,550 | 3/1984 | Wilke et al. | 29/837 |
| 4,590,659 | 5/1986 | Yagi et al. | 29/837 X |
| 4,621,419 | 11/1986 | Hino et al. | 29/741 |
| 4,677,745 | 7/1987 | Ihara | 29/741 |
| 4,705,081 | 11/1987 | Birk et al. | 29/741 X |
| 4,819,326 | 4/1989 | Stannek | 29/837 |
| 4,951,383 | 8/1990 | Amao et al. | 29/743 X |
| 5,157,438 | 10/1992 | Beale | 355/72 |
| 5,208,976 | 5/1993 | Bess et al. | 29/837 |
| 5,218,753 | 6/1993 | Suzuki et al. | 29/740 |
| 5,235,740 | 8/1993 | Kroeker et al. | 29/837 X |
| 5,456,001 | 10/1995 | Mori et al. | 29/741 X |
| 5,457,874 | 10/1995 | Yonezawa et al. | 29/743 |

OTHER PUBLICATIONS

DEK 265 specification shee, DEK Printing Machines Limited.
AP Series, Automated Stencil Printers specificaiton sheet, 1993 MPM Corporation.

*Primary Examiner*—Peter Vo
*Attorney, Agent, or Firm*—Wolf, Greenfield & Sacks, P.C.

[57] ABSTRACT

Pin placement and support apparatus for a circuit board that has a rigid support table, a supply of pins, a pin placement head, and an X-Y transporter that moves the pin placement head relative to the table so as to place the pins at desired and variable locations on the table. To facilitate defining pin locations, the apparatus includes a computer that is programmed to display a board area of the table and pins at user-selected locations within the board area.

12 Claims, 11 Drawing Sheets

SUPPORT APPARATUS FOR CIRCUIT BOARD

BACKGROUND OF THE INVENTION

The invention relates to support apparatus for circuit boards.

When circuit boards are subjected to manufacturing processes, it is often desirable to uniformly support the board across the entire lower surface so that the entire upper surface is in the same plane. It is known to support the circuit board over a table using pins that have upper support surfaces in the same plane. When the lower surface of the circuit board is free of components, the pins can be mounted on a grid. When the circuit board has components mounted on the bottom surface, the pins need to be located to support portions of the lower surface between the components mounted thereon. One way to so locate the pins is to manually place pins having support bases with magnets on a flat upper surface of a metal support table. Another way is described in Beale U.S. Pat. No. 5,157,438, which shows supporting such circuit boards by selectively raising pins mounted in holes on a grid pattern in a housing.

SUMMARY OF THE INVENTION

In one aspect, the invention features, in general, supporting a circuit board using apparatus that has a rigid support table, a supply of pins, a pin placement head, and an X-Y transporter that moves the pin placement head relative to the table so as to place the pins at desired and variable locations on the table. Pins thus do not need to be placed on a grid, and can be aligned with regions on a lower surface of the circuit board not occupied by underboard components regardless of the locations of the unoccupied regions.

In preferred embodiments, the pin placement head is carried on an X-Y gantry that also carries a vision system for viewing the circuit board after it is mounted on the pins. The pins have magnetic bases to hold them in place on the table. The pin placement head includes a plunger that is movable between a raised position for movement by the transporter over the table and a lowered position for placing a pin at a desired location on the table.

To facilitate defining pin locations, the apparatus includes a computer that is programmed to display a board area of the table and pins at user-selected locations within the board area. The user adds pins by moving a cursor to a selected new location and clicking at the location. The user can display a grid of perpendicular lines on the board area and place pins at the intersections of the lines on the display. The user can modify the pin placement by removing individual pins, copying groups of pins or offsetting one or more pins. The user can display a list of the pin coordinates in the order in which the pins will be placed on the board and can redefine the order. The user can have the computer sequentially add pins to the board area on the screen display in the order in which pins will be placed on the board. The user can access optimization modules to automatically redefine the placement order so as to minimize the travel of the placement head and thus the time of placement.

In another aspect, the invention features, in general, pin placement apparatus including a block and a pneumatically actuated plunger in a chamber in the block. The plunger has a central bore that extends upward from the bottom bottom of the plunger to a side opening. A source of compressed air is connected to the chamber to move the plunger from a raised to a lowered position. The block has a by-pass passage that communicates pressure in the chamber from above the plunger, when in the lowered position, to the side opening of the bore to eject the pin after the plunger has been moved to the lowered position.

In preferred embodiments, the block also has a side passage that is aligned with and communicates with the side opening to the bore when the plunger is in the raised position. A vacuum only check valve, a vacuum sensor and vacuum source are connected to the side passage to detect the presence or absence of a pin in the bore when the plunger is in the raised position.

Other advantages and features of the invention will be apparent from the following description of the preferred embodiment thereof and from the claims.

DESCRIPTION OF THE PREFERRED EMBODIMENT

Figure 1:
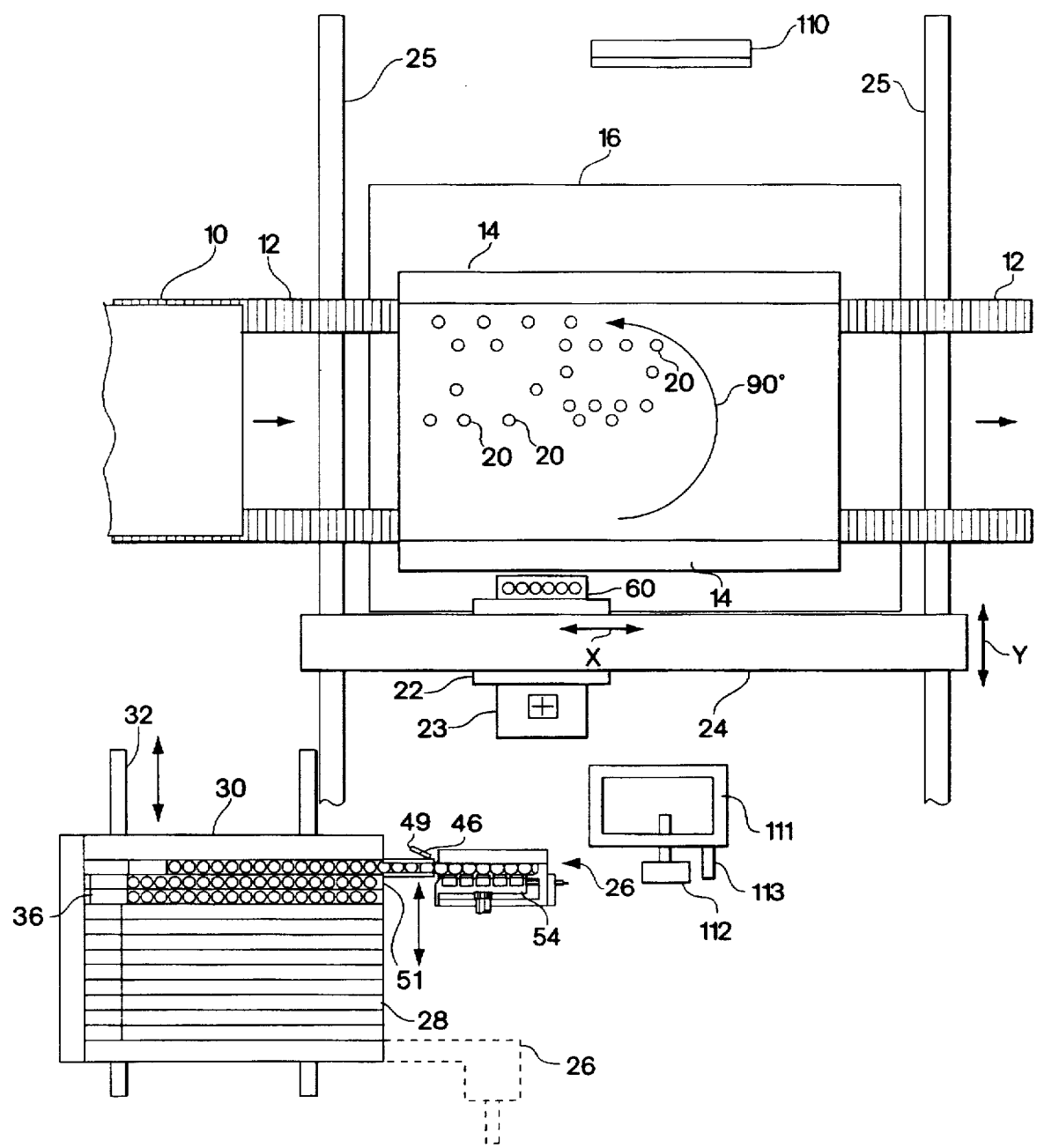
FIG. 1 is a partial plan view of a soldered paste screen printer including pin placement and support apparatus according to the invention.

Referring to FIG. 1, there are shown some of the internal components that are used to support a circuit board in a screen printer that applies solder paste through a stencil. The printer is an improvement of the type of screen printer described in Freeman U.S. Reissue Pat. No. 34,615 and commercially available under the ASP-24 trade designation from MPM corporation, Franklin, Mass., both of which are hereby incorporated by reference.

As shown in FIG. 1, the screen printer includes tractor feed mechanism 12 to supply the boards 10 to edge tractor mechanisms 14 placed over rigid support table 16. Tractor mechanism 18 is used to remove processed boards. A plurality of pins 20 are supported on the upper surface of table 16 in a pattern so that the upper portions of pins 20 support the undersurface of a circuit board at locations not occupied by underboard components or other support pins.

Pins 20 are placed at variable predetermined positions on table 16 by pin placement head 60 (FIG. 5) carried on the back of carriage 22 movable in an X direction along frame 24, which is a linear X-axis of motion. Frame 24 in turn is movable in a Y direction along tracks 25, which is a linear Y-axis of motion. (Vision system 23)is carried on the front of carriage 22. Pin placement head 60 is at a higher elevation than load station 26 and is movable over station 26 to engage the pins. The pins 20 are dispensed by supply tray 28 located at tray support 30, which is movable in the Y direction over linear rails 32. Load station 26 is shown in a delivery position; it can also be moved to a parked position shown in phantom on FIG. 1.

Figure 2:
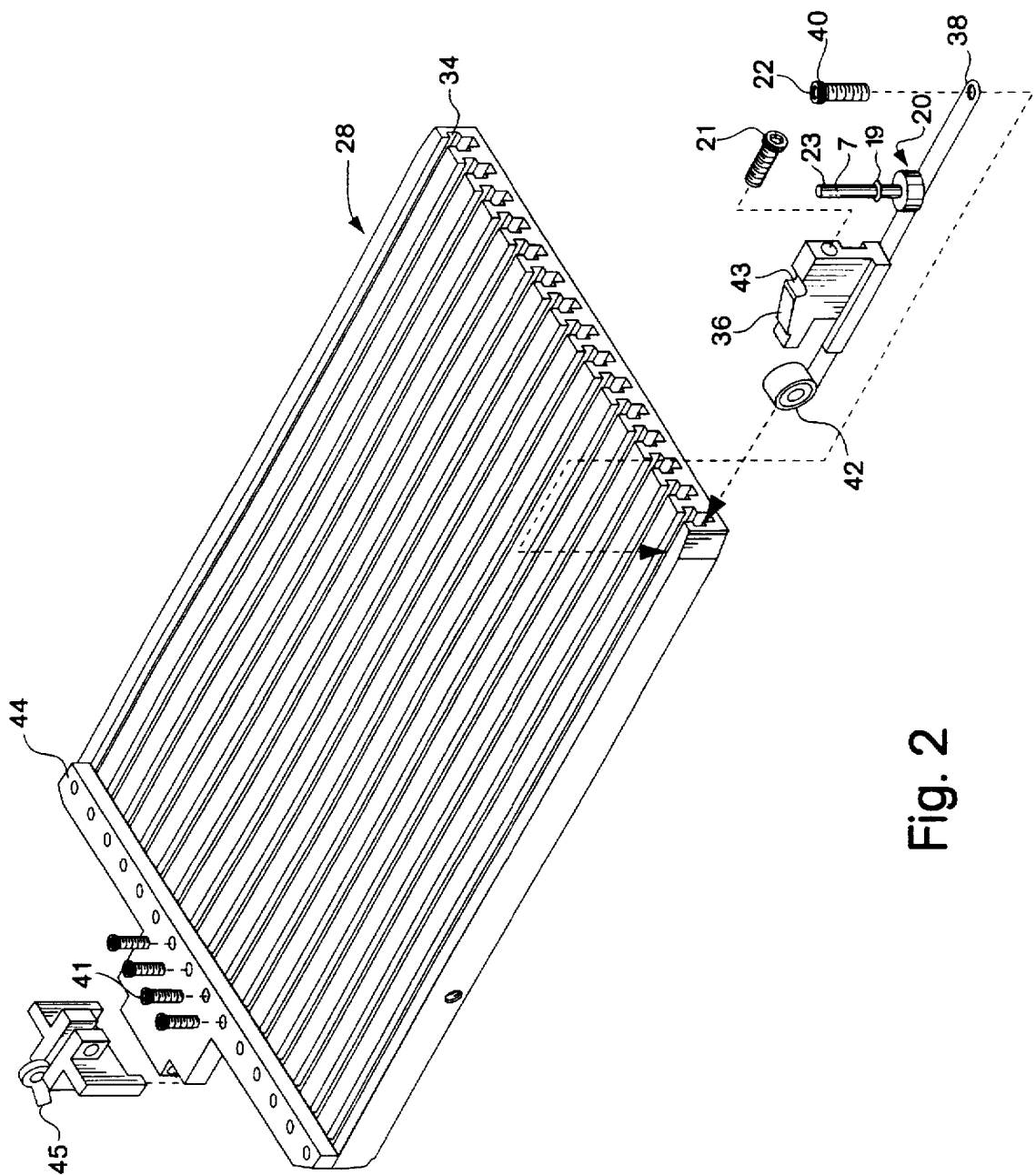
FIG. 2 is a perspective view of a pin supply tray for use with the FIG. 1 apparatus.

Referring to FIG. 2, it is seen that tray 28 includes fifteen slots 34 for receiving,.the bases 21 of pins 20. Pins 20 also have shafts 23' and O-rings 19 thereon. Each slot has a spring biasing mechanism 36 having a constant force coil spring that is secured at end 38 to the end of tray 28 by a bolt 40. The coiled portion 42 of the spring sits within the biasing mechanism 36. Each mechanism 36 biases pins 20 in its respective slot 34 toward the open end of the slot after the mechanism has been released by bar 44 when rotating handle 45 to raise bar 44 and disengage spring plungers 41 from grooves 43 of spring mechanism 36.

Figure 3:
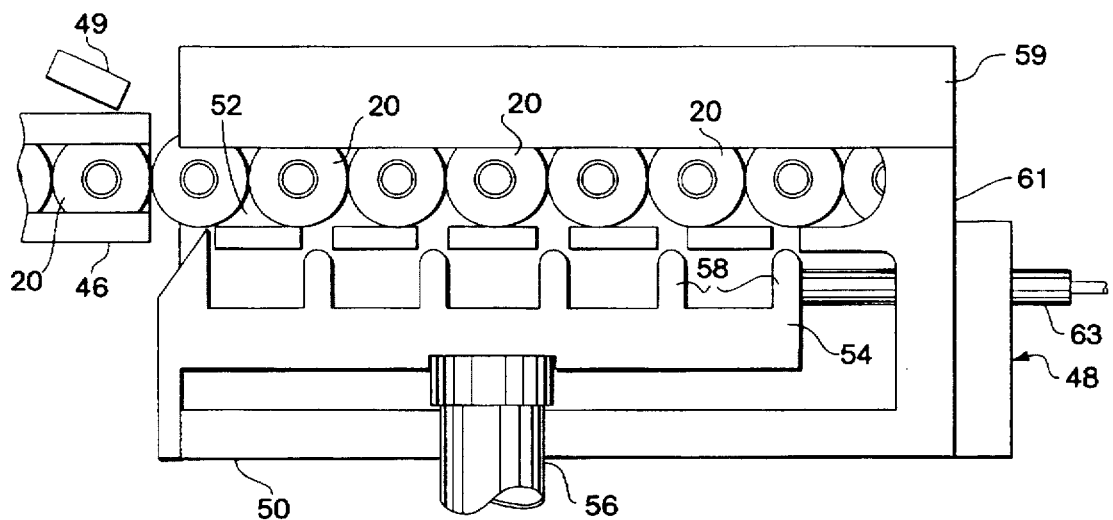
FIGS. 3–4 are plan views of a load station used to hold pins from the FIG. 2 tray in position for pick up by an X-Y transporter.

Referring to FIG. 3, it is seen that load station 26 includes bridge 46 having a slot therein for receiving the bases of pins 20 and spacing assembly 48. Spacing assembly 48 includes a base 50 with a track 52 for receiving the bases of pin 20 supplied thereto through bridge 46. Comb 54 is slidably mounted on base 50 and is actuated by cylinder 56. Pins 20 are supplied from bridge 46 by biasing action of mechanism 36 and are pushed into channel 52 with the bases touching each other while comb 54 is retracted (FIG. 3). Air source 49 is provided to push pins across bridge 46 so that a pin 20 will not interfere with comb 54 on base 50. Comb 54 is then moved toward and into channel 52, and its teeth 58 space apart the adjacent bases of the pins 20 to provide proper 0.4" spacing from each other by a center-to-center distance. This spacing provides the proper position for pick up of six pins 20 at one time by pin placement head 60.

Figure 5:
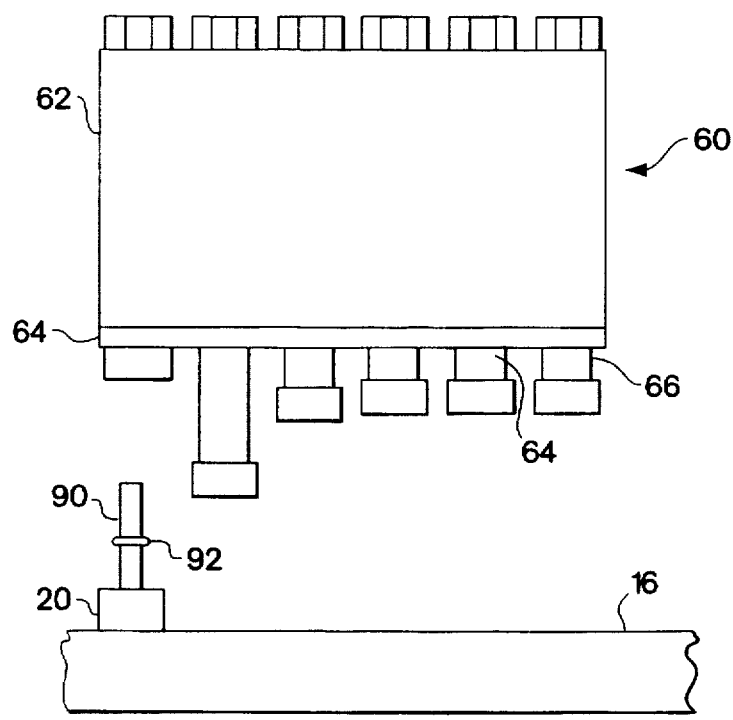
FIG. 5 is a partial elevation showing a pin placement head and a portion of a support table of the FIG. 1 printer.
Figure 6:
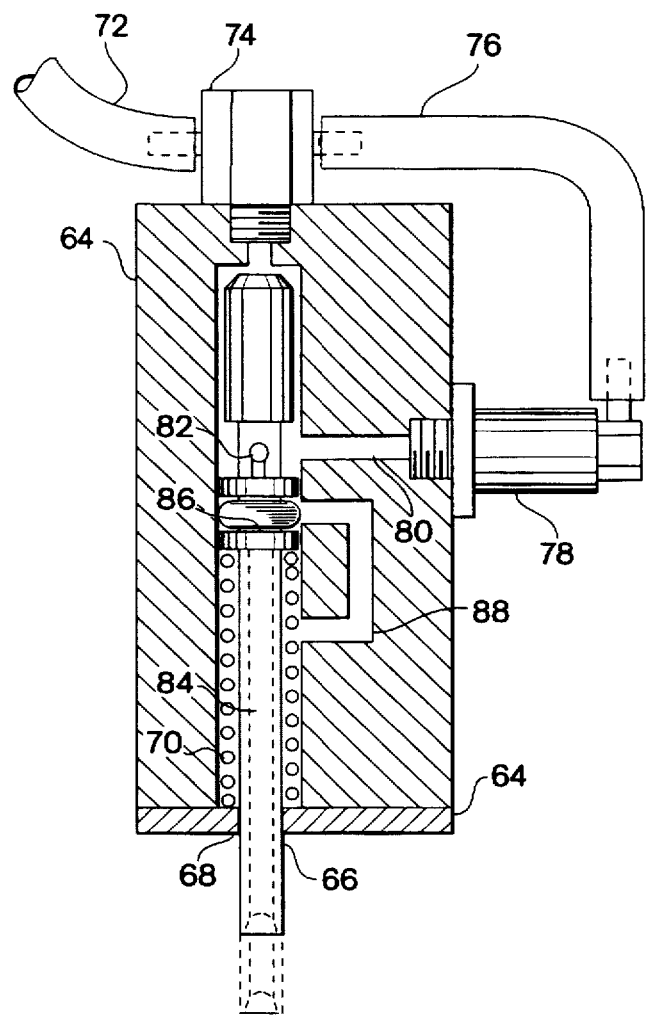
FIG. 6 is a sectional view of the FIG. 5 placement head.

Referring to FIG. 5, it is seen that placement head 60 includes a block 62, lower plate 64 and plungers 66 that extend from lower plate 64. Referring to FIG. 6, is seen that plunger 66 is seated within chamber 68 and is biased in an upward direction by spring 70. Supply hose 72 is connected to fitting 74 which communicates with the top of chamber 68 and also provides a fluid path through hose 76 to check valve 78. Check valve 78 communicates vacuum to side passage 80 but does not communicate pressure. Passage 80 is aligned with opening 82 to central bore 84 within plunger 66 when in the raised position shown in FIG. 6. O-ring 86 provides a seal between the outer surface of plunger 66 and the inner cylindrical surface of chamber 68. Block 62 also includes by-pass passage 88 having an upper end that is spaced from its lower end so that, when plunger 66 is in its lowered position, a by-pass fluid communication will be provided from the chamber 68 above the plunger 66 to side opening 82, which is aligned with the lower part of passage 88.

Figure 7:
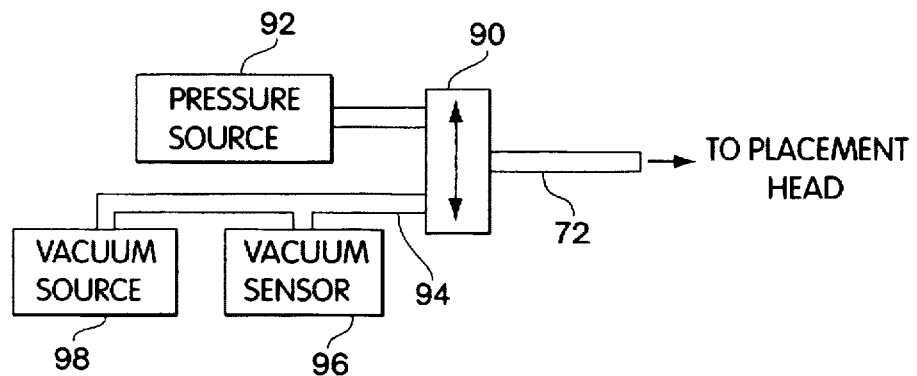
FIG. 7 is a block diagram showing pneumatic components used with the FIGS. 5 and 6 pin placement head.

Referring to FIG. 7, it is seen that tube 72 is connected to blow-off valve 90 which is movable between two positions. In one position, pressure source 92 communicates with tube 72. In the other position, tube 72 communicates with line 94 connected to vacuum sensor 96 and vacuum source 98.

Figure 8:
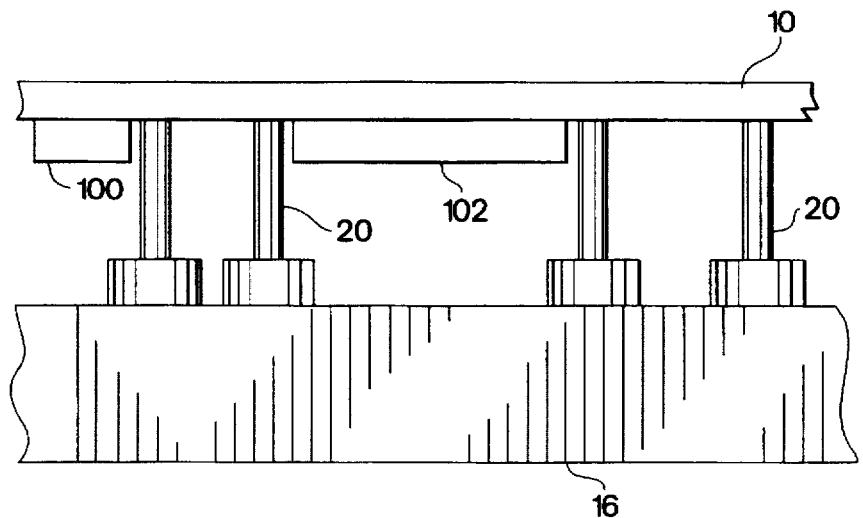
FIG. 8 is a partial elevation showing a rigid support table and pins of the FIG. 1 printer supporting a circuit board having underboard topology.

Referring to FIG. 8, circuit board 10 with underboard components 100, 102 is shown supported above rigid support table 16 via pins 20 that have been positioned so that the upper portions contact the portions of the lower surface of circuit board 10 between underboard components 100, 102.

The apparatus also includes motors and actuators (not shown) to cause the movements described and a computer controller (not shown) that controls the motors and actuators. The apparatus also includes additional sensors beyond those described to control accurate movement of the components described therein. In particular, frame 24 and carriage 22 can be moved to precisely position a pin 20 at any X, Y coordinate location on table 16 to within 0.001", so long as the location does not cause interference with edge tracks 14 or previously placed pins 20. The computer includes a processor, memory for storing data and control programs to carry out the programmed procedures described in FIG. 9 and below, a display monitor for providing displays (e.g., as shown in FIGS. 10–13), and interactive user input devices including a keyboard and a mouse.

Figure 10:
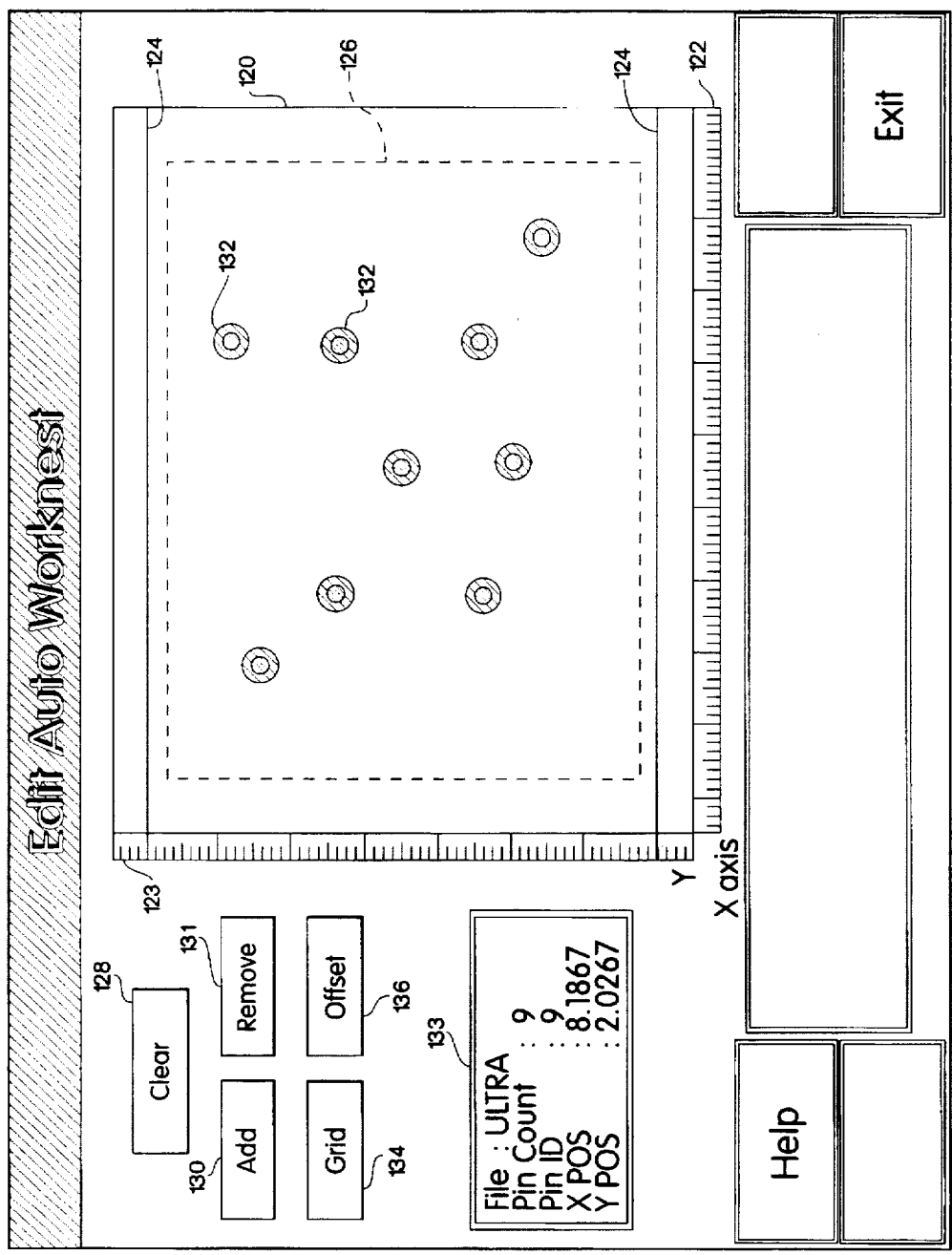
FIGS. 10 to 12 are screen displays of an interactive edit mode of a computer used to define pin locations for the FIG. 1 apparatus and to control the apparatus.
Figure 11:
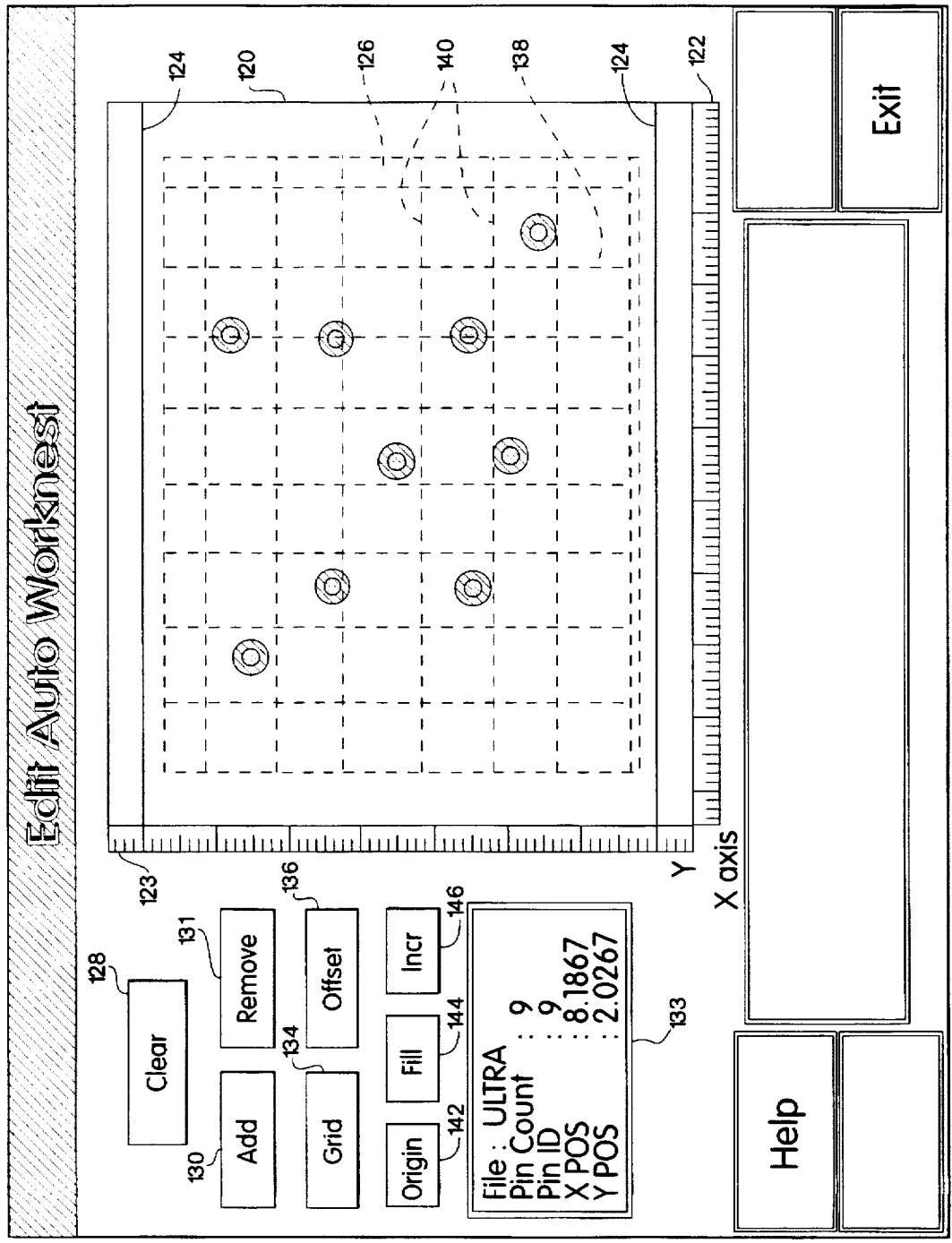
Figure 12:
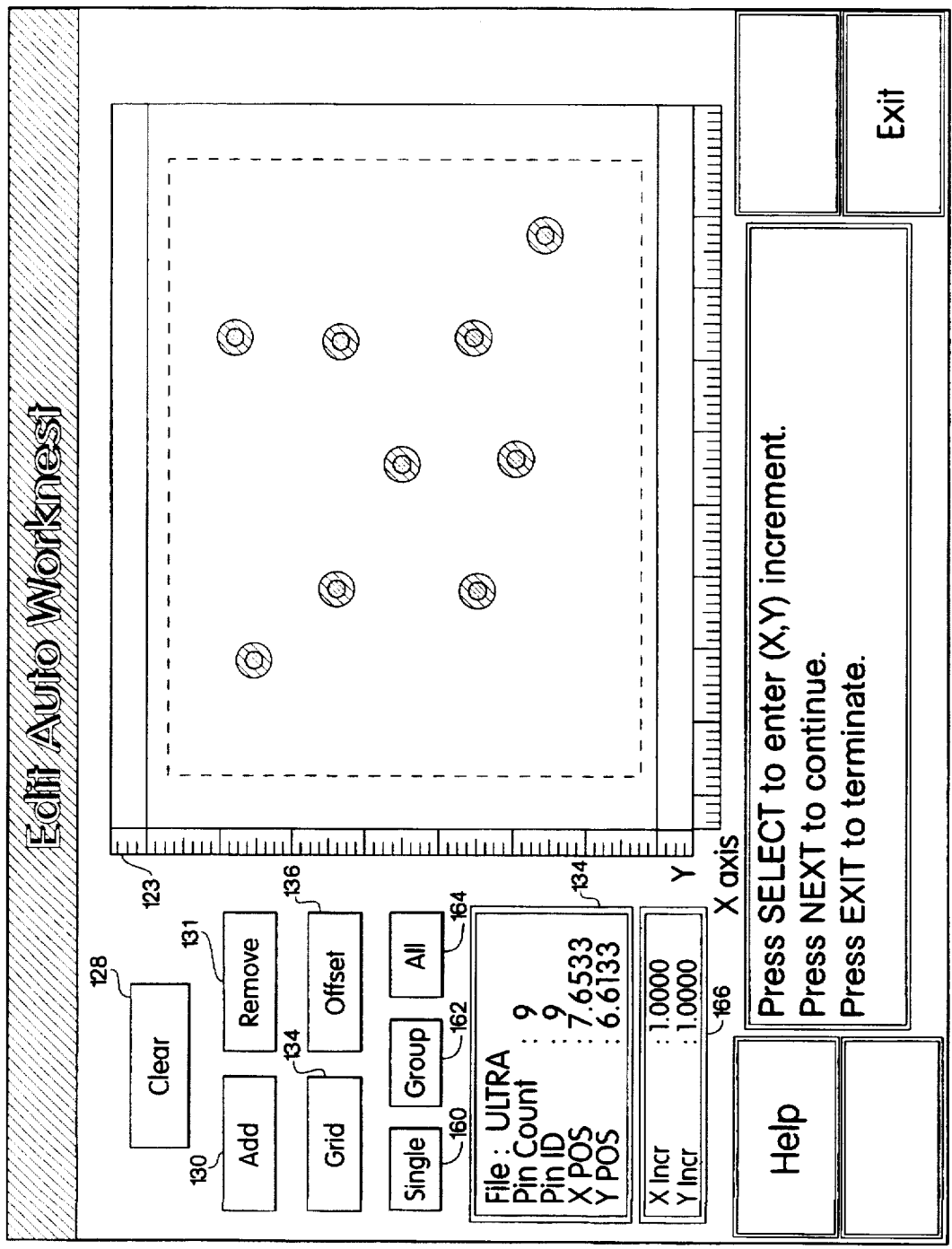

The apparatus employs the screen displays shown on, FIGS. 10–12, to permit the user to define the locations for placing pins using the edit mode. The screen display includes a display of board area 120 indicating the area to be occupied by board 10 on table 16. Scales 122, 123 for the X and Y coordinate axes are adjacent to board area 120, and the origin is at the bottom left-hand corner of board area 120. The display of board area 120 also includes horizontal borders 124 to identify the areas at the top and bottom of the board in which pins cannot be located because they would otherwise interfere with the edge tracks 14. Board area 120 also includes the border 126 that defines an area in which pins are required not to be placed owing to other constraints. The size and orientation of the board area 120 is automatically determined in a set-up mode in which the user inputs information as to the size of the actual board and other information.

Clear button 128, Add button 130, Remove button 131, Grid button 134 and Offset button 136 are activated using the mouse user input device. Add button 130 is used to activate the Add feature in which the user adds pins 132 to board area 120 by moving the cursor 199 to the desired location and clicking on the location. As the cursor is moved, the X and Y position coordinates are automatically updated in box 133, which also displays the file name, the pin count and the pin ID number. The pin count is the total number of selected pins, as is shown on board area 120. The pin ID number identifies the position in the selection sequence in which the pin was originally selected; it also indicates the order in which the pins will be placed on board 10 unless the order is modified by the user or the automated optimization procedures described below.

Pins 132 can be deleted from the board area 120 using Remove button 131 to activate the Remove function and then clicking on the pin to be removed. Clear button 128 will clear the board area 120 of all pins 132.

Activation of Grid button 134 and Offset button 136 cause additional buttons to be displayed directly below them. Activation of the Grid button causes display of a Origin button 142, a Fill button 144 and an Increment button 146 as is shown in FIG. 11. When the Grid button 134 and function are activated, X and Y grid lines 138 and 140 are automatically displayed on board area 120. Box 133 can also include display of the X and Y increments. By activating the Increment button 146, the spacing between the X grid lines 138 and the spacing between the Y grid lines 140 can be independently changed. The activation of the Fill button 144 causes pins 132 to be displayed at all of the intersections of the X grid lines 138 and the Y lines 140 unless doing so would violate a condition regarding preexisting pins 132. Origin button 142 is used to cause the origin of the grid to be moved to the defined new origin coordinates.

When Offset button 136 is activated, additional buttons— Single button 160, Group button 162, and All button 164— and increment box 166 are displayed on the screen. The Single button 160 permits the user to select an individual pin or a selected plurality of pins to be translated according to the coordinates that define the amount and direction of offset. The Group button 162 is activated to permit the user to draw a box around a group of pins aid cause them all to be moved by the selected offset. The All button 164 causes all pins displayed to be translated according to the entered offset. If moving any pins by the offset causes them to go outside of board area 120 or conflict with previously placed pins, they are automatically truncated.

While in the edit mode shown on FIGS. 10–12, the user can activate a display option which lists the coordinates of the pins in the order that they will be placed. The user can, in addition, select an option to have the pins sequentially appear on the board area 120 in order in which they will be placed on the board.

After the selected positions have been entered using the screen displays of FIGS. 10–12, or by importing location information from an external file, the user can activate optimization modules of the software in order to reduce the time spent by the apparatus in placing pins by reducing the distances that the placement head 60 must move during a placement operation. For example, where there are a group of pins arranged near each other on the board from left to right, the left-hand location would be filled with a pin in the left-hand plunger 66, the adjacent location would be filled by a pin from the adjacent plunger 66, and so on, thus minimizing the travel of placement head 60 needed between placing pins. If the pins are to be placed on the board 10 at 0.4" center-to-center spacing (the same center-to-center spacing of pins in plungers 66) or multiples of this up to five, then appropriate plungers 66 are activated at the same time. The optimization modules also take into account the location of load station 26 to minimize distance traveled in taking six pins from the load station, depositing them on the table, and returning to the load station; e.g., placement head 60 will begin or end a sequence of placing six pins at a location closest to load station 26 so that, in general, the apparatus would stop at the closest pin first and thereafter head away from station 26 or head back toward the station as it deposits pins and stop at the closest pin last. Before running, the computer verifies the validity of pin coordinates via a boundary check to confirm that pins are not specified for placement in areas in which pins cannot be placed owing to constraints of the placement equipment, an overlap check to confirm that pins are not specified for placement in overlapping areas, and a total number of pin check to confirm that a maximum pin limit is not exceeded by the specified pins.

Figure 13:
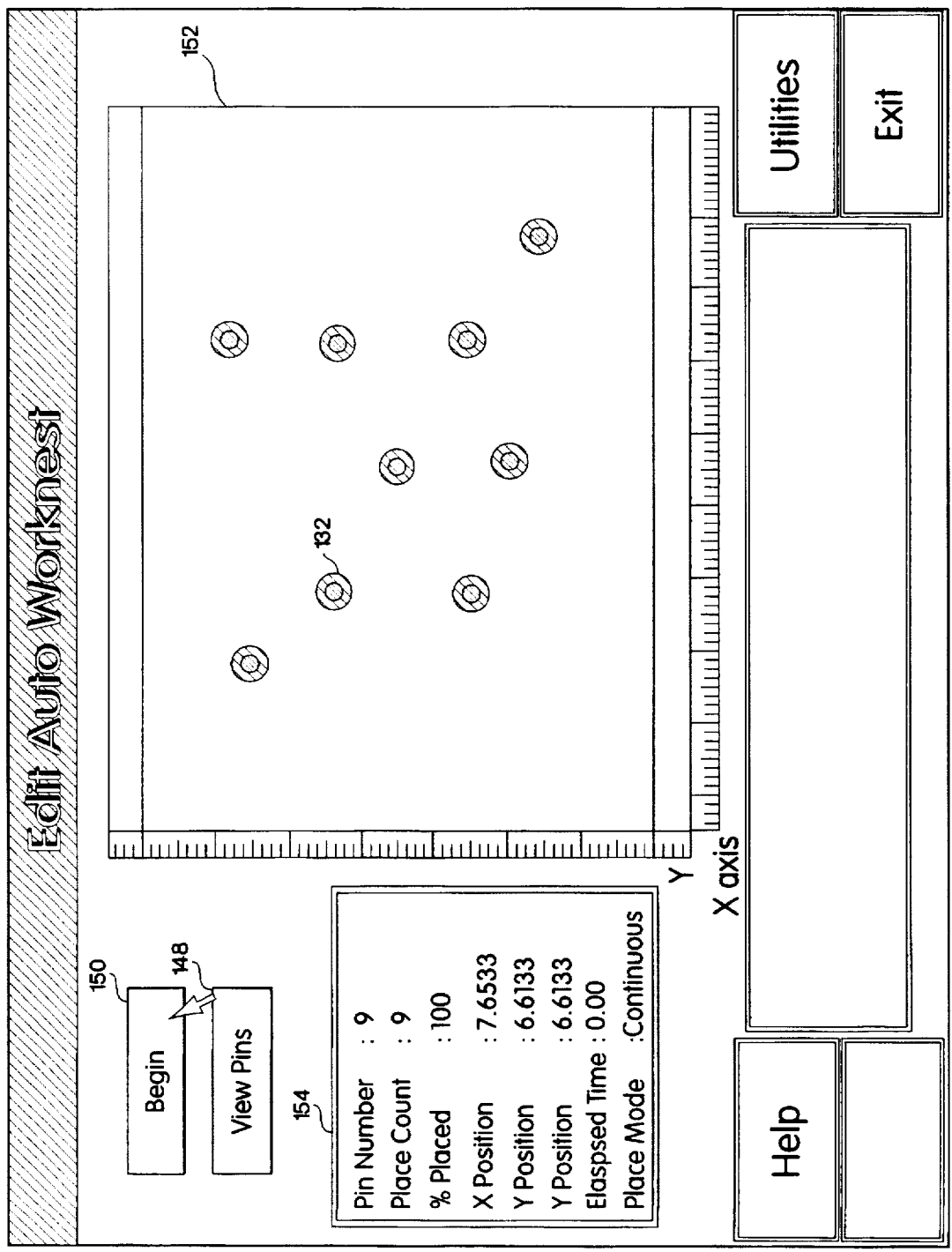
FIG. 13 is a screen display of the computer that is used during placement of the pins.

Referring to FIG. 13, there is shown the screen display used when the user is ready to place pins. This display includes View button 148, Begin button 150, board area 152, and data window 154. View button 148 causes pins to be sequentially shown board area 152 in the order in which they will be placed on the board 10 by the apparatus. The Begin button 150 causes the apparatus to begin its placement procedure. As the pins are placed, they are displayed on board area 152, and the coordinates of the pins being displayed are shown along with the elapsed time, the percentage placed, and the numbers that have been placed. The user can select to run in the Continuous mode in which the apparatus runs at full speed to place the pins in the optimum minimum time. The user can also select to run in the Step mode in which the apparatus is advanced one step at a time and stops, and the user must initiate the next step. The Step mode permits the user to view the placement procedure for trouble shooting and educational purposes.

Figure 9:
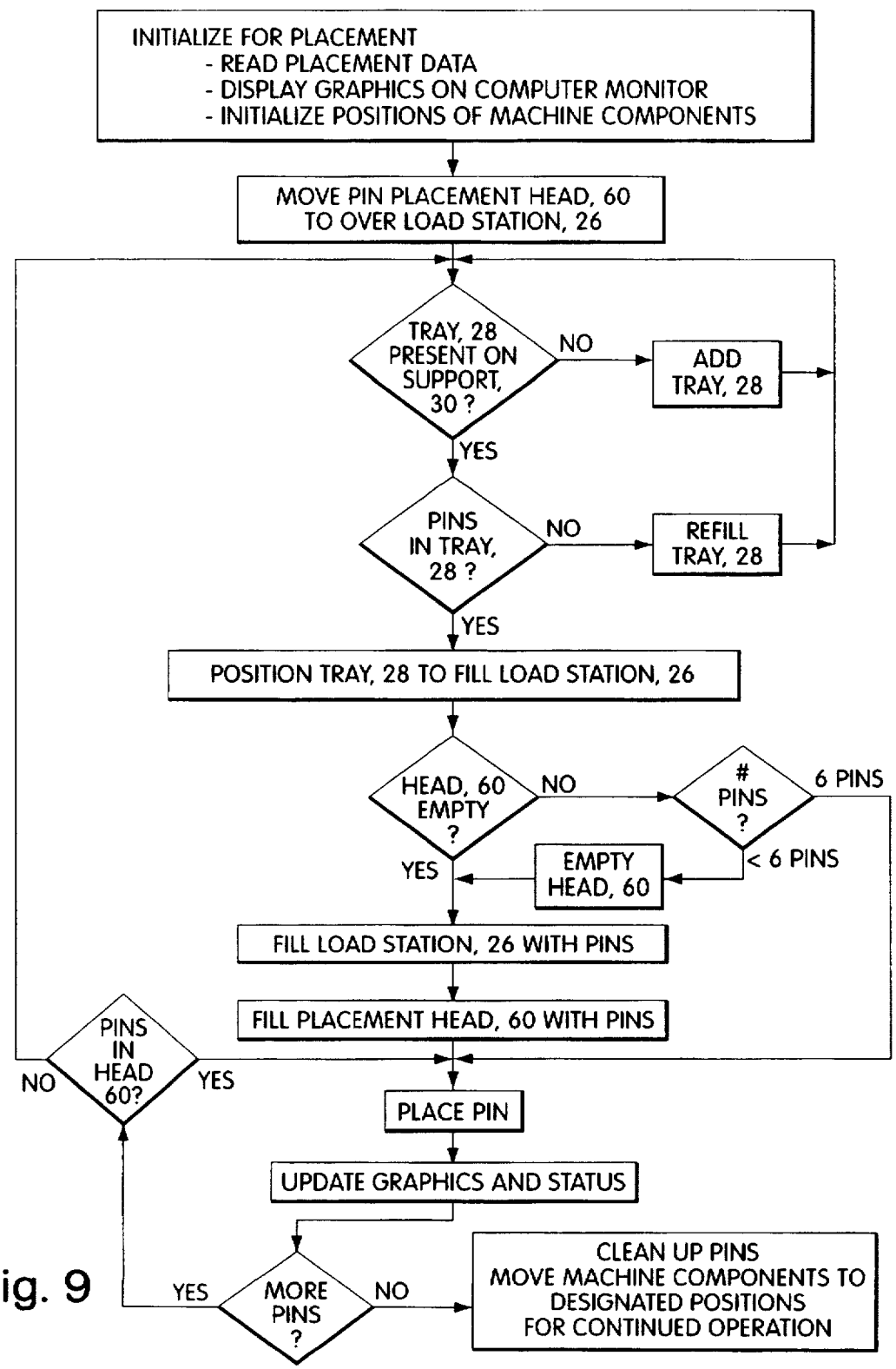
FIG. 9 is a flow chart describing the operation of the FIG. 1 printer to place pins.

Referring to FIGS. 1 and 9, in operation, tray 28 is loaded with pins 2.0 while the biasing mechanisms 36 are in retracted positions. All fifteen slots 34 are filled with pins, and tray 28 is loaded onto support apparatus 30. (On FIG. 1, tray 28 is shown only partially filled.) Spring biasing mechanisms 36 are then released. Tray 28 is indexed on support 30 to position a row of pins in a slot 34 for movement into bridge 46. At this time the cartridge gate 51 on the front of the support 30 is opened. Load station 26 stays in the delivery position shown in FIG. 1 when pins are being placed by placement head 60 as Sell as when pins are being picked up from load station 26 by head 60. Pins are automatically biased across the bridge into load station 26, while comb 54 is in the retracted position shown in FIG. 3. When there are no more pins in a slot 34, cartridge gate 51 is closed, and tray 28 is indexed on support 30 to the next slot 34 containing pins.

Figure 4:
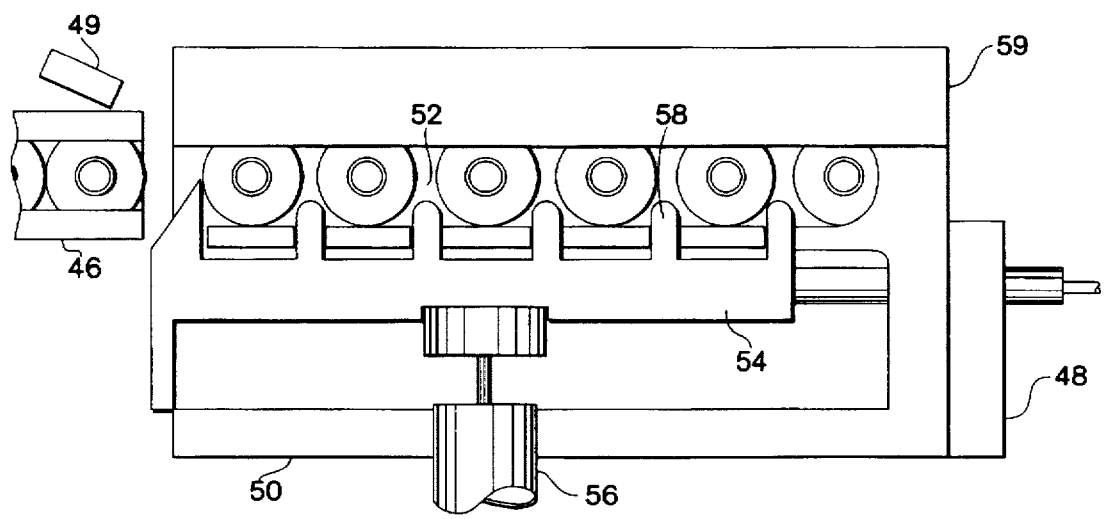

At this time, all bases 21 of pins 20 are adjacent to each other. Sensor 61 confirms the presence of first pin 20. Cylinder 56 then pushes comb 54 forward, and teeth 58 separate bases 21 of pins 20 by the proper distance for pick up by placement head 60. Sensor 63 confirms that comb 54 is forward, thus separating pins 20 in bridge 46 from pins 20 in load station 26. The carriage 22 is then moved over load station 26, and spacing assembly 48 of load station 26 is raised so that the shafts 23 of pins 20 are inserted into bores 84 of plungers 66. Bridge 46 remains in its lowered position, and a plate extending downward at the end of comb 54 blocks pins from leaving bridge 46. As load station 26 is raised, roof 59 automatically retracts to completely expose the bases 21 of pins 20 (FIG. 4). Comb 54 is then retracted, and load station 26 is lowered. Roof 59 automatically closes after clearing bases 21 of pins 20 engaged by placement head 60. The use of roof 59, the overhanging portions over slots 34, and the overhanging portions on bridge 46 act to contain pins 20 at all times. Vacuum is applied to allow sensing by sensor 96 to verify pin engagement. O-ring 19 on pin shaft 23 aids in sealing for vacuum sensing and also guarantees pin retention even with loss of vacuum.

With the pins all engaged by placement head 60, head 60 is moved by frame 24 in the Y direction and by carriage 22 in the X direction until the pin 20 to be ejected first is in the desired position over rigid table 16. At this time, pressure is applied by blow-off valve 90 to supply hose 72. The pressure causes plunger 66 to be extended to the phantom position shown in FIG. 6, at which time the opening 82 is aligned with the lower portion of by-pass 88. Pressure is communicated through by-pass 88 from the chamber at the top of the plunger through the by-pass and through the opening 82 to bore 84 in plunger 66. This causes the pin to be ejected from plunger 66 with the O-ring 19 clearing the bottom of plunger 66, and the magnetic base 21 being securely attracted to rigid metal table 16. At this time, blow-off valve 90 is moved to the vacuum position, and the plunger is raised to the retracted position (by spring 70 and vacuum) while the pin remains below on table 16.

FIG. 5 shows placement head 60 after the left-hand most pin has been deposited in the desired position on table 16. The adjacent plunger 66 has been lowered and is ejecting pin 20 via continued application of pressure through bore 84 within plunger 66. Placement head 60 is moved to desired locations to place the remaining pins in plungers 66, and then returns to load station 26 to pick up six more pins for placement.

After all pins have been placed at the desired positions, the circuit board 10 is moved over tractor mechanisms 12 and 14 to the desired location and supported on pins 20 by lowering of the board relative to table 16. When it is desired to change the pattern of pins, they are cleared from the upper surface of rigid table 16 via sweeper 110 attached to the squeegee (not shown) for the screen printing operation. Table 16 is first rotated 90°, and edge tractor mechanisms 14 are moved to be spaced from each other by 6" before sweeper 110 (just under 6" wide) is lowered to just above table 16 and moved in the Y direction toward container 112, which is raised to be even with table 16. The cleared pins 20 are collected in container 111. Sensor 113 detects the presence of container 111, and sensor 112 detects when container 111 is full with pins.

Other Embodiments

Other embodiments of the invention are within the scope of the following claims. E.g., the vision could scan a board to identify locations of the components, and board area 120 could indicate locations of components to assist in determining where to place pins.

What is claimed is:

1. Support apparatus for a circuit board utilizing circuit board support pins, the improvement comprising:
   a support table having a support surface for supporting at least one circuit board support pin,
   a supply for holding the at least one circuit support pin,
   a pin placement head operable to transport the at least one circuit support pin from the supply and to release it on said support surface, and
   an X-Y transporter that moves said pin placement head relative to said table in both X and Y directions so as to place the at least one circuit support pin at any selectable location on said support surface; and
   wherein said X-Y transporter includes an elongated frame that is aligned with the X-axis and is movable along an elongated frame aligned with the Y-axis; and
   wherein said pin placement head is carried on the elongated frame; and
   wherein the supply may hold a plurality of circuit support pins, the circuit support pins having upright shafts and bases that support the pins on said support surface; and
   wherein said placement head has a bore for receiving a said upright shaft of a said pin and further comprising a vacuum source connected to said bore via a fluid path to retain said shaft in said bore; and further comprising a source of compressed air connected to said fluid path to eject said upright shaft of said pin during placement; and
   wherein said pin placement head has a plunger movable between a raised position for transport by said transporter over said board and a lowered position for placement of a pin at a desired and a lowered position for placement of a pin at a desired location on said table; and
   wherein said bore is in said plunger; and
   wherein said placement head includes a block defining a chamber in which said plunger is sealably mounted for movement into and out of said chamber, and wherein said fluid path communicates with said chamber to move said plunger to said lowered position by said source of compressed air, and further comprising a vacuum sensor connected to said fluid path to detect the presence of said shaft in said bore, and wherein said plunger has a side opening to said bore near the top of said bore that is aligned with a side passage in said block when said plunger is in said raised position, and further comprising a first by-pass passage from said side passage to said fluid path, and a check valve along said by-pass passage for vacuum only communication is said raised position to sense the presence or absence of said shaft to said bore.

2. The apparatus of claim 1 wherein said plunger has a side opening to said bore near the top of said bore and a seal around the top of said plunger to the chamber above said side opening, and wherein said block has a by-pass passage that communicates pressure in said chamber from above said plunger, when in said lowered position, to said side opening of said bore to eject said pin after said plunger has been moved to said lowered position.

3. Support apparatus for a circuit board utilizing circuit board support pins, the improvement comprising:
   a support table having a support surface for supporting at least one circuit board support pin,
   a supply for holding the at least one circuit support pin,
   a pin placement head operable to transport the at least one circuit support pin from the supply and to release it on said support surface, and
   an X-Y transporter that moves said pin placement head relative to said table in both X and Y directions so as to place the at least one circuit support pin at any selectable location on said support surface; and
   wherein said X-Y transporter includes an elongated frame that is aligned with the X-axis and is movable along an elongated frame aligned with the Y-axis, and wherein said pin placement head is carried on the elongated frame; and
   wherein said supply of at least one circuit support pin is remote from said pin placement head and includes a load station for pick up of at least one circuit support pin by said pin placement head; and
   wherein said pin placement head carries a plurality of pins in a fixed pattern with respect to each other, sand said load station presents said pins in said pattern; and
   wherein said pins are presented for pick up as a row of pins spaced from each other, and wherein said load station includes a comb that has teeth that move between pins supplied to said load station contiguously in order to separate said pins at the proper spacing.

4. Support apparatus for a circuit board utilizing circuit board support pins, the improvement comprising:
   a support table having a support surface for supporting at least one circuit board support pin,
   a supply for holding the at least one circuit support pin,
   a pin placement head operable to transport the at least one circuit support pin from the supply and to release it on said support surface, and
   an X-Y transporter that moves said pin placement head relative to said table in both X and Y directions so as to place the at least one circuit support pin at any selectable location on said support surface; and
   wherein said X-Y transporter includes an elongated frame that is aligned with the X-axis and is movable along an elongated frame aligned with the Y-axis, and wherein said pin placement head is carried on the elongated frame; and
   wherein said supply of at least one circuit support pin is remote from said pin placement head and includes a load station for pick up of at least one circuit support pin by said pin placement head; and
   wherein said supply is provided by a removable tray that has a plurality of slots for arranging said pins into rows that are aligned, one at a time, with said load station.

and further comprising a tray support on said apparatus for receiving said tray; and wherein said tray includes a spring biasing mechanism for each row of pins.

5. The apparatus of claim 4 wherein said tray support includes an indexer to move said tray to align a new slot with said load station.

6. In an apparatus for placement of at least one pin on a support table having a support surface, wherein the improvement comprises a programmable device that generates control signals defining coordinates for placement of said at least one pin at a selected location, said programmable device having a visual user interface and a user input device to select the location for placement of the at least one pin, said programmable device being programmed to display a board area of said table on the visual user interface and to display the at least one pin at said selected location; and wherein said programmable device is programmed to display a pin on said board area at a selected location upon activation of said user input device, and to create control signals to define coordinates for said displayed pin by said programmable device.

7. The apparatus of claim 6 wherein said programmable device is programmed to respond to user inputs to display a grid of perpendicular lines on said board area, to place pins at the intersections of the lines on said display, and to create control signals defining the coordinates for said pins at said intersections.

8. The apparatus of claim 6 wherein a plurality of pins may be selectively placed on said support surface of said table by a pin placement head and wherein said control signals define the order in which said selected pins will be placed on said support surface of said table and wherein said computer is programmed to display the coordinates of said selected pins in the order of placement on the support surface at said table, and to receive inputs to redefine the order of placement.

9. The apparatus of claim 6 wherein said computer is programmed to sequentially add to said board area on said visual user interface selected pins in the order in which said control signals define placing them on said support surface of said table.

10. A pin placement apparatus comprising a block defining a chamber having a first opening at or near the top for connection to a fluid path and a second opening at the bottom, a plunger sealably mounted for movement through said second opening into said chamber to a raised position and out of said chamber to a lowered position for placement of a pin, said plunger having a central bore that extends upward from the bottom of said plunger to a side opening, a seal around the top of said plunger to said chamber above said side opening, a fluid path connected to said first opening, and a source of compressed air connected to said fluid path to move said plunger from said raised to said lowered position, said block having a first by-pass passage that communicates pressure in said chamber from above said plunger, when in said lowered position, to said side opening of said bore to eject said pin after said plunger has been moved to said lowered position.

11. The apparatus of claim 10 wherein said block has a side passage that is aligned with and communicates with said side opening to said bore when said plunger is in said raised position, and further comprising a second by-pass passage from said side passage to said fluid path, a check valve along said second by-pass passage for vacuum only communication, and a vacuum sensor and vacuum source connected to said fluid path to detect the presence or absence of said shaft in said bore when said plunger is in said raised position.

12. The apparatus of claim 11 further comprising a valve on said fluid path operable to selectively connect said source of compressed air or said vacuum source to said bore.

* * * * *